United States Patent

Adachi et al.

[11] Patent Number: 5,872,487
[45] Date of Patent: Feb. 16, 1999

[54] FAST FREQUENCY SWITCHING SYNTHESIZER

[75] Inventors: Hisashi Adachi; Hiroaki Kosugi; Tomoki Uwano, all of Osaka; Takeshi Miura; Youichi Morinaga, both of Kanagawa, all of Japan

[73] Assignee: Matsushita Electric Industrial Co., Ltd., Osaka, Japan

[21] Appl. No.: 869,546

[22] Filed: Jun. 5, 1997

[30]  Foreign Application Priority Data

Jun. 11, 1996 [JP] Japan ................................. 8-148999

[51] Int. Cl.⁶ ...................................................... H03L 7/18
[52] U.S. Cl. ............................ 331/1 A; 331/16; 327/159; 327/106; 375/376
[58] Field of Search ................................ 331/16, 17, 1 A; 375/376; 327/156, 159, 147, 106, 107

[56]  References Cited

U.S. PATENT DOCUMENTS 4,912,432  3/1990  Galani et al. ................................. 331/2
5,420,545  5/1995  Davis et al. ................................. 331/17
5,694,089  12/1997  Adachi et al. ............................. 331/16

*Primary Examiner*—Steven Mottola
*Assistant Examiner*—Arnold Kinkead
*Attorney, Agent, or Firm*—Merchant, Gould, Smith, Edell, Welter & Schmidt, P.A.

[57]  ABSTRACT

A frequency synthesizer that can switch an output frequency fast and generates little spurious output is provided. This frequency synthesizer comprises a phase locked loop including a voltage-controlled oscillator, a high frequency divider, a phase frequency comparator and a low-pass filter. The divisor controller circuit supplies a divisor that varies cyclically to the high frequency divider for a fractional dividing operation. When switching the output frequency, a passing bandwidth of the low-pass filter is enlarged to widen a loop bandwidth of the phase locking loop for fast switching. After switching, the passing bandwidth of the low-pass filter is reduced to narrow the loop bandwidth for reduction of a spurious output, at the timing when a predetermined period has passed for the switched output frequency to stabilize substantially.

7 Claims, 6 Drawing Sheets

FAST FREQUENCY SWITCHING SYNTHESIZER

BACKGROUND OF THE INVENTION

The present invention relates to a frequency switching synthesizer improved in switching speed of the output frequency and in reduction of a spurious output.

One of the methods for switching the output frequency fast in a frequency switching synthesizer is the fractional dividing method. In this method, a divisor (i.e., a ratio of an original frequency and a desired output frequency) of a high frequency divider is increased cyclically, so as to realize an average divisor with an accuracy less than 1.0. As a result, a phase comparing frequency becomes higher than a desired output frequency interval, and fast switching of the output frequency is realized.

FIG. 6 shows a frequency synthesizer using the fractional dividing method in the prior art. This frequency synthesizer comprises a phase locked loop and a divisor controller circuit. The phase locked loop includes a voltage-controlled oscillator 901, a high frequency divider 902, a phase frequency comparator 904 and a low-pass filter 905. The divisor controller circuit 903 includes an accumulator 908 having a phase adder 906 and a phase register 907, a divisor adder 909, and a data register 910.

The phase adder 906 adds data given by the data register 910 and an output of the phase register 907 to make a sum that is fed back to the phase register 907. The divisor adder 909 adds one to the divisor given by the data register 910 and outputs the resulting data to the high frequency divider 902 when the accumulator 908 overflows, and otherwise passes the divisor to the high frequency divider 902.

The high frequency divider 902 divides an output signal of the voltage-controlled oscillator 901 in accordance with the divisor given by the divisor adder 909, and outputs the divided signal to the phase frequency comparator 904. The phase frequency comparator 904 compares a phase of the output signal of the high frequency divider 902 with that of a reference signal, and outputs a phase difference signal. This phase difference signal passes a low-pass filter 905 and is supplied to the voltage-controlled oscillator 901, which controls the output frequency in accordance with the phase difference signal.

As mentioned above, the divisor that the divisor controller circuit 903 gives to the high frequency divider 902 becomes one larger than the normal divisor cyclically, so an average output frequency becomes a little larger than the normal divisor. The output frequency of the voltage-controlled oscillator 901 becomes a product of the frequency of the reference signal and the average divisor of the high frequency divider 902.

However, such a frequency synthesizer using the fractional dividing method has a disadvantage. The output signal of the phase frequency comparator 904 influences and changes the controlling voltage of the voltage-controlled oscillator 901 cyclically via the low pass filter 905. This cyclic change may cause an undesired spurious signal to be superimposed on the output signal of the voltage-controlled oscillator 901. On the other hand, if a loop bandwidth is narrowed to suppress the spurious signal, it requires a long time to stabilize the controlling voltage of the voltage-controlled oscillator 901 when switching the output frequency, resulting in difficulty in performing fast switching.

SUMMARY OF THE INVENTION

A frequency synthesizer according to the present invention to solve the above-mentioned problem comprises a phase locked loop including a voltage-controlled oscillator, a high frequency divider, a phase frequency comparator and a low-pass filter; a divisor controller circuit for supplying a divisor to the high frequency divider; and means for controlling the phase-locked loop so that a loop bandwidth of the phase locked loop is enlarged when an output frequency of the voltage-controlled oscillator is switched, and is narrowed when the switched output frequency is substantially stabilized after the passing of a predetermined period. The frequency synthesizer having such a configuration can switch the output frequency fast by enlarging the loop bandwidth, and can suppress a spurious output by narrowing the loop bandwidth when the switched output frequency is stabilized after switching.

It is preferable that the divisor controller circuit includes an accumulator having a phase adder and a phase register. When the output frequency of the voltage-controlled oscillator is switched, data in the phase register are initialized, and the phase adder adds its input data and the output of the phase register to make sum data that are given back to the phase register. The phase register inputs the data at the same time as the changing of an output signal of the high frequency divider. The divisor controller circuit enlarges the divisor cyclically by adding one to the divisor only when the accumulator overflows, and the high frequency divider divides the output signal of the voltage-controlled oscillator in accordance with the divisor. The phase frequency comparator generates a phase difference between an output signal of the high frequency divider and a reference signal, and the phase difference signal is filtered by the low-pass filter and given to the voltage-controlled oscillator, which switches the output frequency to be equal to a product of the reference frequency and an average divisor of the high frequency divider. When the switched output frequency is substantially stabilized after passing of a predetermined period, the loop bandwidth is narrowed at the timing that the phase register becomes a predetermined value.

The accumulator can operate using the output signal of the high frequency divider as a clock. It is preferable that the accumulator is made of n-bits, the accumulator switches the output frequency of the voltage-controlled oscillator fast with a wide loop width of the phase locked loop, and the loop bandwidth is narrowed when the value of the phase register becomes $2^{n-1}$ (two raised to the power n−1) after the switched output frequency is substantially stabilized.

Preferably, the controlling means of the phase locked loop widens the passing band width of the low-pass filter for widening the loop width of the phase locked loop, and narrows the passing band width of the low-pass filter for narrowing the loop width of the phase locked loop.

It is more preferable to provide a reference divider for dividing an output signal of a signal source to make a reference signal. In this embodiment, when the output frequency of the voltage-controlled oscillator is switched, the divisor of the high frequency divider is reduced to generate a cyclic change, and the divisor of the reference divider is also reduced to raise the reference frequency. After the switched output frequency is substantially stabilized, the divisor of the high frequency divider is raised to a constant integer, and the divisor of the reference divider is enlarged to lower the reference frequency. In this operation, the ratio of the average divisor of the high frequency divider and the divisor of the reference divider is constant before and after switching. It is also preferable to provide a timer circuit for maintaining the phase locked loop in a wide loop width for a predetermined period until the switched output frequency is substantially stabilized, and after passing of the period, narrowing the loop bandwidth when the phase register attains a predetermined value.

It is also preferable that if a value of an input data of the accumulator is zero, the loop bandwidth of the phase locked loop is maintained wide for a predetermined period, and is narrowed at the first clock after passing of the predetermined period.

DETAILED DESCRIPTION OF THE PREFERRED EMBODIMENTS (First Embodiment)

Figure 1:
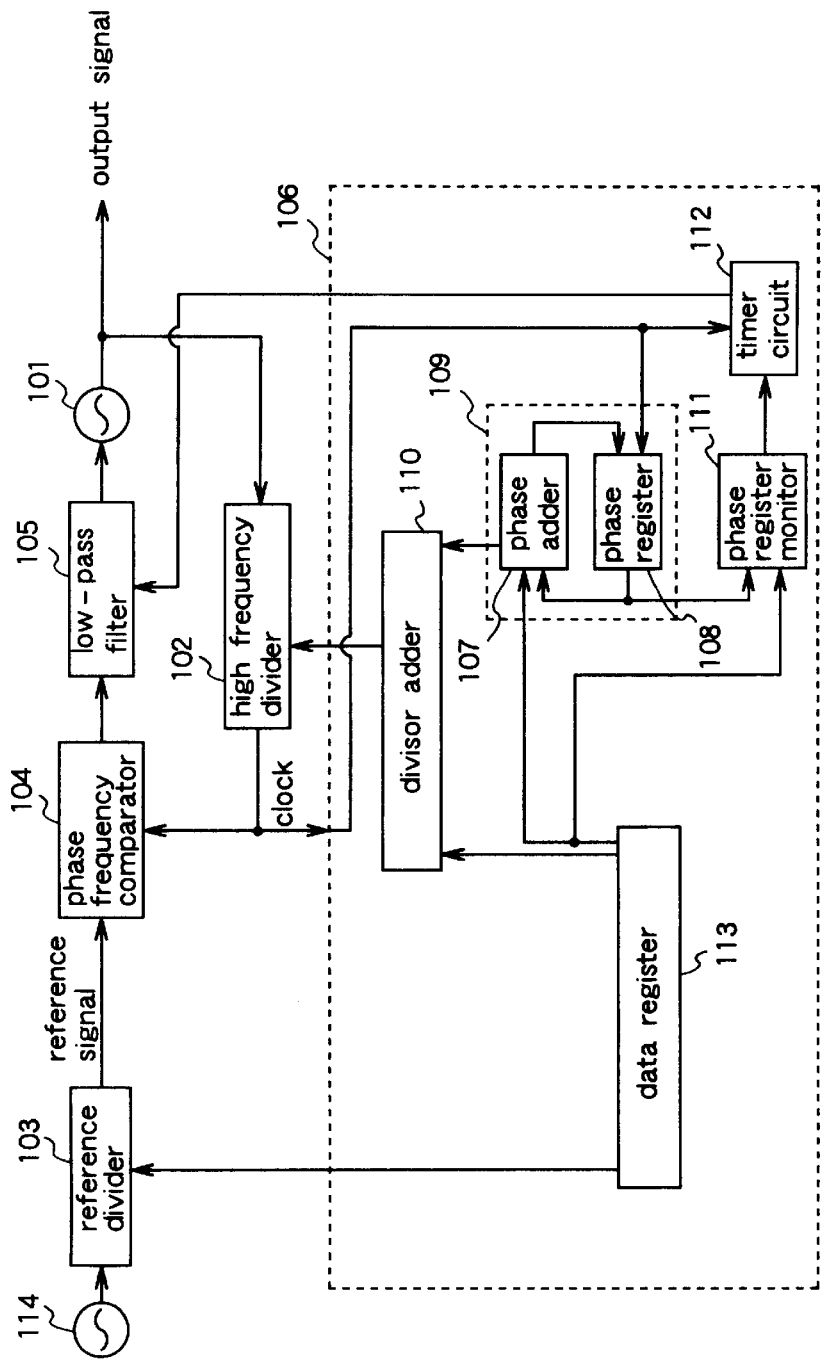
FIG. 1 is a block diagram of a frequency synthesizer according to a first embodiment of the present invention.

FIG. 1 shows a frequency synthesizer according to a first embodiment of the present invention. This frequency synthesizer comprises a phase locked loop and a divisor controller circuit. The phase locked loop includes a voltage-controlled oscillator 101, a high frequency divider 102, a reference divider 103, a phase frequency comparator 104 and a low-pass filter 105. The divisor controller circuit 106 includes an accumulator 109 having a phase adder 107 and a phase register 108, a divisor adder 110, a phase register monitor 111, a timer circuit 112 and a data register 113.

The high frequency divider 102 divides an output frequency of the voltage-controlled oscillator 101 in accordance with a data value given by the divisor adder 110. The reference divider 103 divides an output signal of a signal source 114 in accordance with the data value given directly by the data register 113, and outputs the reference signal. The phase frequency comparator 104 compares a phase of the output signal of the high frequency divider 102 with that of the reference divider 103, and outputs a phase difference signal. This phase difference signal passes the low-pass filter 105 and is supplied to the voltage-controlled oscillator 101. The voltage-controlled oscillator 101 controls the output frequency in accordance with the phase difference signal.

The phase adder 107 of the accumulator 109 adds n-bit data K given by the data register 113 and an output of the phase register 108, and gives its sum data back to the phase register 108. The phase register 108 updates its output every clock corresponding to the output of the high frequency divider 102.

The phase adder 107 overflows and generates a carry when its sum data becomes more than L, that is 2 raised to the power n. The carry is given to the divisor adder 110. The divisor adder 110 passes data M from the data register 113 to the high frequency divider 102 if no carry exists, while it gives M+1 to the high frequency divider 102 if a carry exists. Therefore, M+1 is given K times, and M is given L-K times out of L clocks. Thus, the average given value, i.e. the divisor during L clocks, is M+K/L. By setting the value of K at an integer between 0 and (L−1), a divisor can be generated at an interval of 1/L. Thus, the fractional dividing operation is performed.

Figure 2:
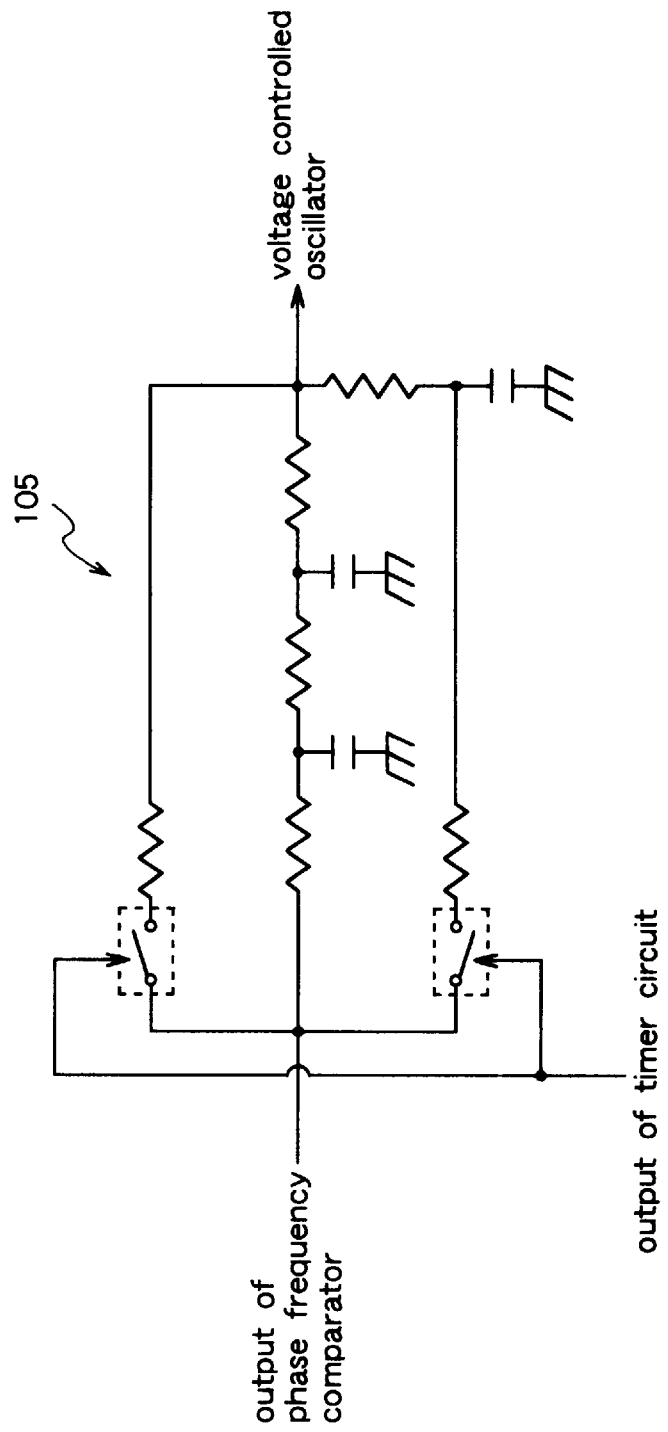
FIG. 2 is a circuit diagram of a low-pass filter of the frequency synthesizer shown in FIG. 1.

When changing the output frequency of the voltage-controlled oscillator 101, the phase register 108 is initialized to zero and the timer circuit 112 outputs a signal for enlarging the passing bandwidth of the low-pass filter 105. The phase register monitor 111 outputs a signal to the timer circuit 112 every time when the value of the phase register 108 becomes two raised to the power n−1. The timer circuit 112 is preset to a value corresponding to a period that is necessary for the switched output frequency of the voltage-controlled oscillator 101 to stabilize substantially. After the passing of this period, the phase register monitor 111 outputs a signal for the first time when the output of the timer circuit 112 changes and the passing bandwidth of the low-pass filter is narrowed. The spurious signal superimposed on the output of the voltage-controlled oscillator 101 is reduced by making the loop bandwidth narrow. FIG. 2 shows an example of the low-pass filter 105. In this circuit, two switches are closed to connect the resistors in parallel for the wide passing bandwidth, and are opened for the narrow passing bandwidth.

Figure 3:
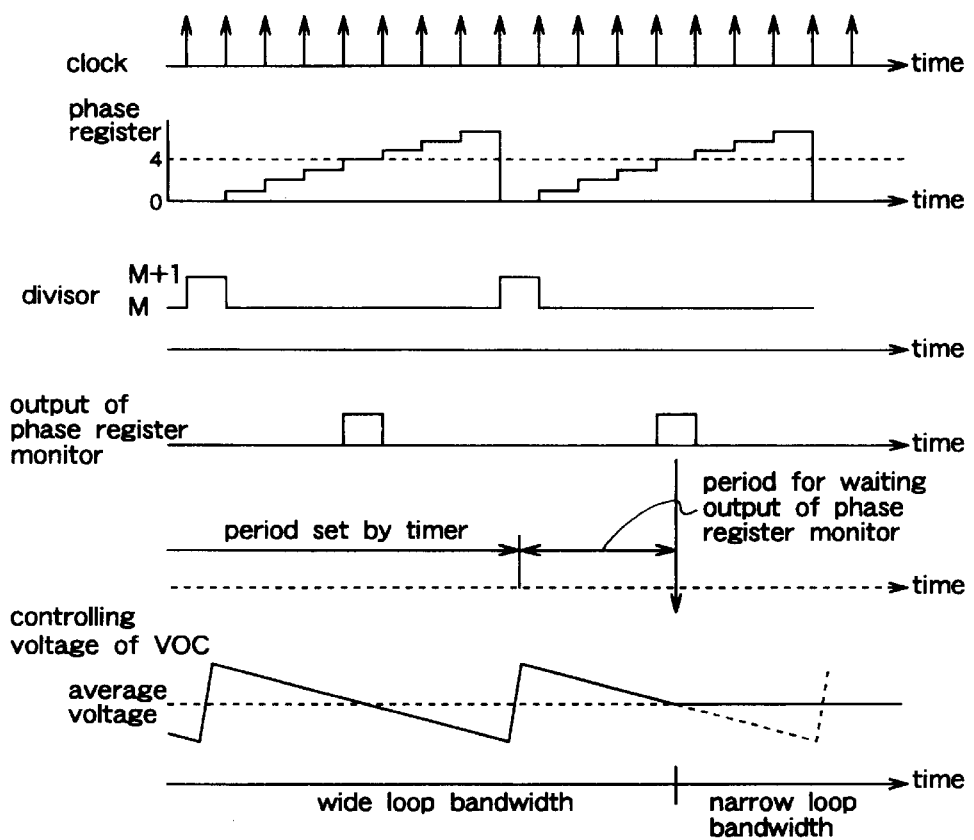
FIG. 3 is a timing chart for the operation of narrowing the loop bandwidth of the frequency synthesizer shown in FIG. 1.
Figure 4A:
FIG. 4a–4g show changing values of the phase register of the frequency synthesizer shown in FIG. 1.
Figure 4E:
Figure 4B:
Figure 4F:
Figure 4C:
Figure 4G:
Figure 4D:

FIG. 3 shows a timing chart for the operation of narrowing the loop bandwidth after the switched output frequency is stabilized substantially under the condition of L=8, K=1. When the phase register 108 overflows and returns to zero, the divisor of the high frequency divider 102 changes from M to M+1 every time. When the phase register 108 becomes four, the phase register monitor 111 outputs a signal. The controlling voltage of the voltage-controlled oscillator 101 alters along a sawtooth waveform that has a gradient opposite to that of the changing value of the phase register 108. The output of the phase register monitor 111 is generated when the controlling voltage with the sawtooth waveform is the closest to the average value, so narrowing the loop bandwidth at this timing can result in the smallest deviation of the controlling voltage and shortest period for switching the output frequency.

FIG. 4a–4g show changing values of the phase register 108 in seven cases where K=1, 2 . . . , or 7. Possible values of the phase register 108 are different depending on the value of K. However, the values include 4 in each case, and this value is closest to the average value of the variation range. Therefore, it is preferable to change the loop bandwidth at the timing when the value of the phase register 108 becomes 4, so as to minimize the deviation of the controlling voltage at switching and shorten the period for switching the output frequency. If K=0, the phase register monitor 111 outputs the clock for the timer circuit 112 to realize the timing for narrowing the loop bandwidth.

As mentioned above, this embodiment can realize fast switching of an output frequency by enlarging the passing bandwidth of the low-pass filter and by performing the fractional dividing operation. After the switched output frequency is stabilized, the passing bandwidth of the low-pass filter as well as the loop bandwidth is narrowed at the timing when the value of the n-bit phase register becomes two raised to the power n−1. Thus, the spurious output is reduced, and the deviation of the controlling voltage of the voltage-controlled oscillator at switching is minimized, so that the period for switching is shortened.

(Second Embodiment)

Figure 5:
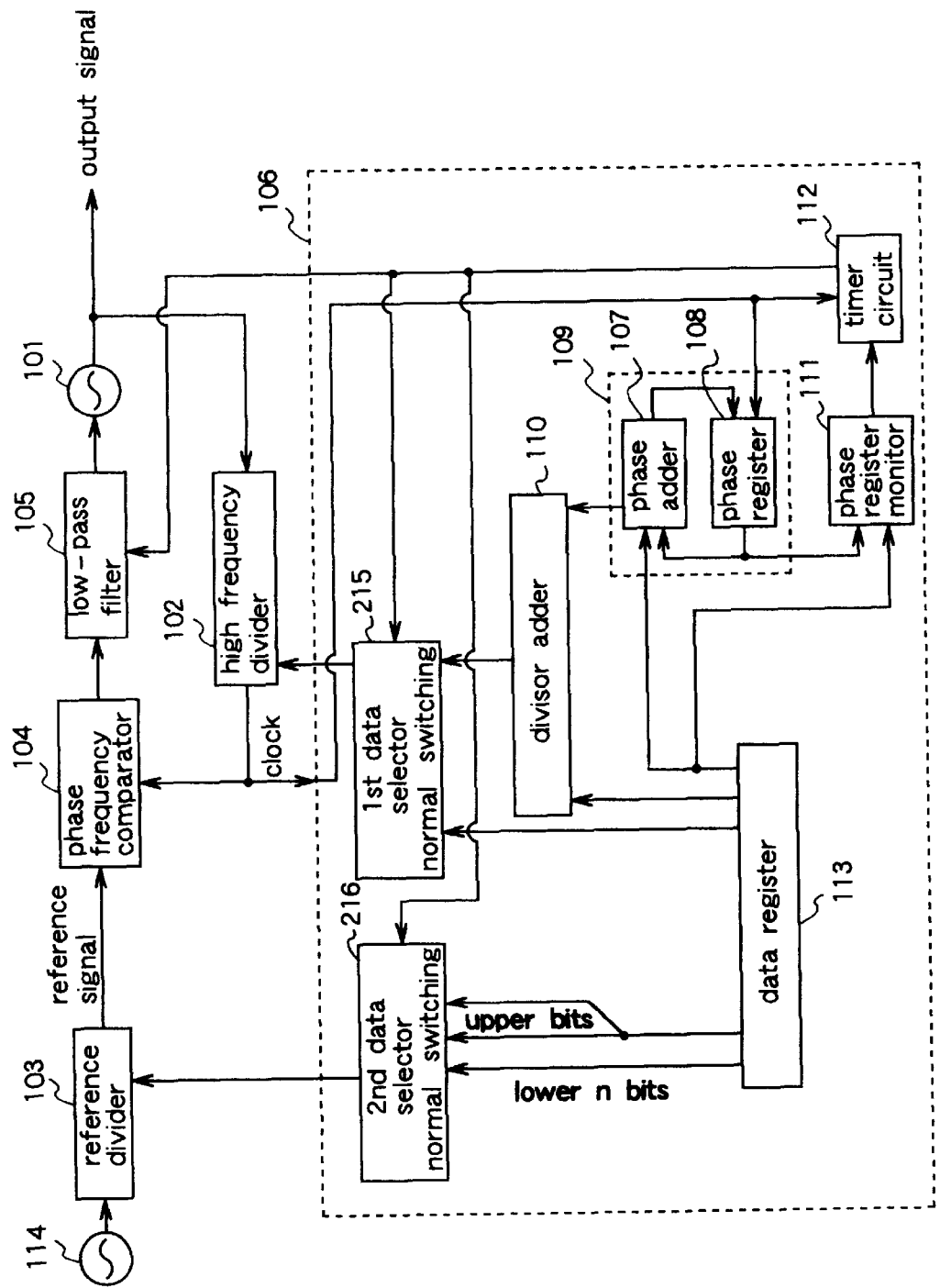
FIG. 5 is a block diagram of a frequency synthesizer according to a second embodiment of the present invention.
Figure 6:
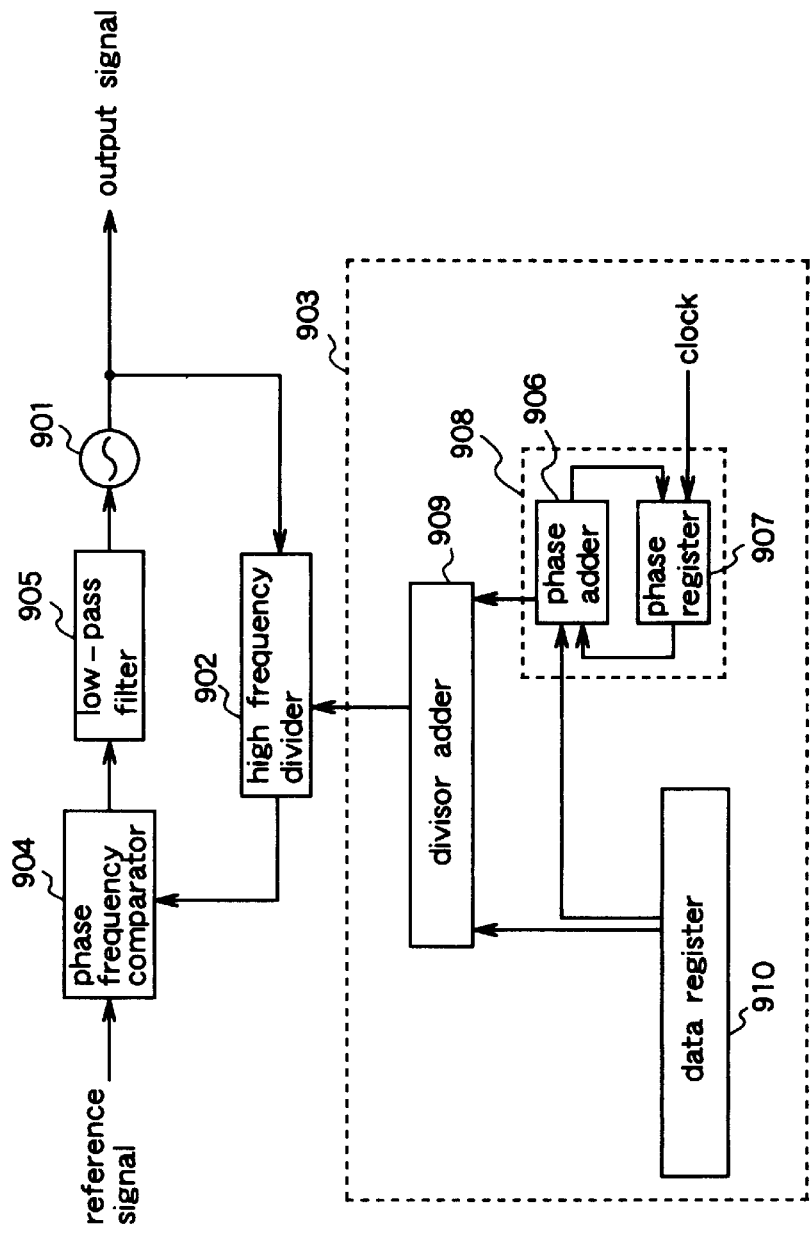
FIG. 6 is a block diagram of a frequency synthesizer in the prior art.

FIG. 5 shows a frequency synthesizer according to a second embodiment of the present invention. In this block diagram, the block having the same function as in FIG. 1 is identified by the same reference number. This embodiment includes additional function blocks, namely a first data selector 215 for the high frequency divider, and a second data selector 216 for the reference divider.

The high frequency divider 102 divides the output frequency of the voltage-controlled oscillator 101 in accordance with the data given by the first data selector 215 of the divisor controller circuit 106. The reference divider 103 divides the output frequency of the reference signal source 114 in accordance with the data value given by the second data selector 216. The first data selector 215 and the second data selector 216 switch their output data for frequency switching or for normal time in accordance with the output signal of the timer circuit 112.

The second data selector 216 passes the data of the divisor from the data register 113 to the reference divider 103 during normal time. On the contrary, when switching the output frequency, it gives the upper bits of the divisor to the reference divider 103. The least significant bit (LSB) of the upper bit data is the (n+1)th bit of the original data, The first data selector 215 passes the data from the data register 113 to the high frequency divider 102 during normal time, while at switching time, it inputs data from the divisor adder 110 and gives it to the high frequency divider 102. The same data as given to the first data selector 215 are split into lower n bits that are given to the phase adder 107 of the accumulator 109 and remaining upper bits that are given to the divisor adder 110.

When switching the output frequency of the voltage-controlled oscillator 101, the value of the phase register 108 is initialized to zero, and the output signal of the timer circuit 112 enlarges the passing bandwidth of the low-pass filter 105. The output signal of the timer circuit 112 also sets the first data selector 215 and the second data selector 216 to frequency switching operation. The phase register monitor 111 outputs a signal to the timer circuit 112 when the value of the phase register 108 becomes two raised to the power $n-1$.

The timer circuit 112 is preset to the value corresponding to a period for substantially stabilizing the switched output frequency of the voltage controlled oscillator 101. The timer circuit 112 outputs a signal at the timing when the phase register monitor 111 outputs a signal for the first time after the passing of the above-mentioned period. The output signal of the timer circuit 112 narrows the passing bandwidth of the low-pass filter 105, and sets the first data selector 215 and the second data selector 216 to the normal operation. The fractional dividing operation at frequency switching has a reference frequency of two raised to the power n, so it can switch the frequency faster than an integer dividing operation. It also has an advantage in that it generates little spurious signal since the integer dividing operation with a constant divisor is performed after frequency switching.

As mentioned above, this embodiment can switch output frequencies fast by enlarging the passing bandwidth of the low-pass filter and by performing the fractional dividing operation with wide loop bandwidth when switching the output frequency. After the switched output frequency is stabilized, the passing bandwidth of the low-pass filter is narrowed at the timing when the value of the n-bit phase register of the accumulator becomes two raised to the power $n-1$. As a result, while reducing a spurious output, this embodiment can minimize a deviation of the controlling voltage of the voltage-controlled oscillator and shorten the period for switching the output frequency.

According to the present invention, as mentioned above, a fast switching of an output frequency can be realized by enlarging the loop bandwidth at switching, while low spurious can be realized by narrowing the loop bandwidth after the switched output frequency is stabilized.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

We claim:

1. A frequency synthesizer comprising:
    a phase locked loop including a voltage-controlled oscillator, a high frequency divider, a phase frequency comparator and a low-pass filter;
    a divisor controller circuit for supplying a divisor to the high frequency divider; and
    means for controlling the phase-locked loop so that a loop bandwidth of the phase locked loop is widened when an output frequency of the voltage-controlled oscillator is switched, and is narrowed when the switched output frequency is substantially stabilized after passing of a predetermined period, wherein the divisor controller circuit includes an accumulator having a phase adder and a phase register, wherein when the output frequency of the voltage-controlled oscillator is switched, the phase register is initialized, the phase adder adds its input data and the output of the phase register to make sum data that is given back to the phase register, the phase register inputs the data at the same time as changing of an output signal of the high frequency divider, the divisor controller circuit enlarges the divisor cyclically by incrementing the divisor only when the accumulator overflows, the high frequency divider divides the output signal of the voltage-controlled oscillator in accordance with the divisor, the phase frequency comparator generates a phase difference between an output signal of the high frequency divider and a reference signal, the phase difference signal is filtered by the low-pass filter and given to the voltage-controlled oscillator, which switches the output frequency to be equal to a product of the reference frequency and an average divisor of the high frequency divider, and wherein when the switched output frequency is substantially stabilized after passing of a predetermined period, the loop bandwidth is narrowed at the timing that the phase register becomes a predetermined value.

2. The frequency synthesizer according to claim 1, wherein the accumulator operates using the output signal of the high frequency divider as a clock.

3. The frequency synthesizer according to claim 2, wherein the accumulator is made of n-bits, the accumulator switches the output frequency of the voltage-controlled oscillator fast with a wide loop width of the phase locked loop, and the loop bandwidth is narrowed when the value of the phase register becomes two raised to the power $n-1$ after the switched output frequency is substantially stabilized.

4. The frequency synthesizer according to claim 1, wherein the controlling means of the phase locked loop widens the passing band width of the low-pass filter for widening the loop width of the phase locked loop, and narrows the passing band width of the low-pass filter for narrowing the loop width of the phase locked loop.

5. The frequency synthesizer according to claim 1, further comprising a reference divider for dividing an output signal of a signal source to make a reference signal, wherein when the output frequency of the voltage-controlled oscillator is switched, the divisor of the high frequency divider is reduced to generate a cyclic change, the divisor of the reference divider is also reduced to raise the reference frequency, after the switched output frequency is substantially stabilized, the divisor of the high frequency divider is raised to a constant integer, and the divisor of the reference divider is enlarged to lower the reference frequency, so that the ratio of the average divisor of the high frequency divider and the divisor of the reference divider is constant before and after switching.

6. The frequency synthesizer according to claim 1, further comprising a timer circuit for maintaining the phase locked loop in a wide loop bandwidth for a predetermined period until the switched output frequency is substantially stabilized, and after passing of the predetermined period, narrowing the loop bandwidth when the phase register becomes a predetermined value.

7. The frequency synthesizer according to claim 1, wherein if a value of an input data of the accumulator is zero, the loop bandwidth of the phase locked loop is maintained wide for a predetermined period, and is narrowed at the first clock after passing of the predetermined period.

* * * * *